(12) United States Patent
Bupp et al.

(10) Patent No.: US 6,639,155 B1
(45) Date of Patent: *Oct. 28, 2003

(54) HIGH PERFORMANCE PACKAGING PLATFORM AND METHOD OF MAKING SAME

(75) Inventors: James R. Bupp, Endwell, NY (US); Donald S. Farquhar, Endicott, NY (US); Lisa J. Jimarez, Newark Valley, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1007 days.

(21) Appl. No.: 08/872,782

(22) Filed: Jun. 11, 1997

(51) Int. Cl.[7] ................................ H05K 1/16
(52) U.S. Cl. ................ 174/260; 174/255; 174/261; 361/795; 257/700
(58) Field of Search ................ 174/255, 260, 174/261, 262, 265, 266; 257/668, 700, 702, 703, 705, 759, 642, 698; 438/125, 126; 361/748, 793, 795, 717, 792; 428/421, 422, 901

(56) References Cited

U.S. PATENT DOCUMENTS

| 4,783,359 A | * 11/1988 | Fleischer et al. ....... 174/255 X |
| 4,830,704 A | * 5/1989 | Voss et al. ..................... 216/18 |
| 4,847,146 A | 7/1989 | Yeh et al. ..................... 428/332 |
| 4,849,284 A | 7/1989 | Arthur et al. ................ 428/325 |
| 4,965,702 A | 10/1990 | Lott et al. ..................... 361/764 |
| 5,038,996 A | 8/1991 | Wilcox et al. ............... 228/121 |
| 5,194,713 A | 3/1993 | Egitto et al. ........... 219/121.71 |
| 5,229,550 A | * 7/1993 | Bindra et al. ................ 174/262 |
| 5,249,101 A | 9/1993 | Frey et al. .................... 361/717 |
| 5,264,664 A | 11/1993 | McAllister et al. ......... 174/261 |
| 5,290,971 A | * 3/1994 | Hamaguchi et al. ........ 174/267 |
| 5,357,194 A | * 10/1994 | Ullman et al. ............... 324/754 |
| 5,615,477 A | * 4/1997 | Sweitzer ................. 361/743 X |

FOREIGN PATENT DOCUMENTS

JP          2-186694      * 7/1990

OTHER PUBLICATIONS

"Process Considerations in the Fabrication of Teflon Printed Circuit Boards", by Light et al, 1994 Proceedings, 44 Electronic Components & Technology Confererence, 5/94.

"High Performance Carrier Technology: Materials And Fabrication", by Light et al, 1993 International Electronics Packaging Conference, San Diego, California, vol. One.

"High Performance Carrier Technology", by Heck et al, 1993 International Electronics Packaging Conference, San Diego, California, vol. One.

* cited by examiner

Primary Examiner—Albert W. Paladini
(74) Attorney, Agent, or Firm—McGuireWoods LLP; William E. Schiesser

(57) ABSTRACT

A packaging platform for interconnecting integrated circuit chips and cards, in which the platform is a circuitized fluoropolymer-based laminate carrier including high purity fluoropolymer protective barriers on its surfaces.

13 Claims, 5 Drawing Sheets

HIGH PERFORMANCE PACKAGING PLATFORM AND METHOD OF MAKING SAME

BACKGROUND OF THE INVENTION

1. Field of the Invention

The present invention generally relates to electronic packages and, more particularly, to the fabrication of an improved module which serves as an interconnecting platform between an integrated circuit chip and a card.

2. Description of the Prior Art

One standard type of electronic package involves three distinct levels of components involving an integrated circuit package commonly known as a chip, a module which serves as an interconnecting platform between one or more chips and a card, and the card which provides electronic communication along a multiplicity of modules mounted thereon. Elimination of one of the above three distinct levels of packaging has been long standing goal of those skilled in the art of designing and producing electronic packages. The advantages of eliminating one of the levels of packaging are many, but the prime motivations are cost reduction, improved electrical performance, and superior overall reliability of the package.

One prior approach of module manufacturers has been to make the module component large enough to be able to package the entire function of the computer in one module. However, the performance of the very large metallized ceramic modules produced suffered due to the high dielectric constant of the ceramic material and the manufacturing costs were very high with this approach. More specifically, as the size of the module was increased, the time that it took for electrical signals to pass between the outer extremities of the module became too extended. This is due to the high dielectric constant of the ceramic material. Module fabricators cannot easily change their module material set to incorporate different materials with lower dielectric coefficients than the conventionally used ceramics since their existing base manufacturing processes have been customized to handle and process ceramic materials.

Card fabricators have attempted to produce laminated multilayer multiple chip carriers (modules) which use standard printed circuit board materials and processes. But these packages cannot support very high density chips, nor are they compatible with all of the various conventional chip attachment techniques. Other card manufacturers have made great strides in the direct mounting of chips onto their card products. Indeed, use of materials such as polyimide and Teflon™ have allowed the card manufacturers to produce chip carriers (modules) which have low dielectric constants. However, the card and board manufacturers are limited to relatively low wiring densities due to the nature of the processes that are normally run in a board fabricator, and the general lack of contamination control required to produce circuit lines and spaces with high yields in the order of 25 microns or less that are required to wire-out the current generation of high density chips. It thus has been unattractive from a cost standpoint for a board fabricator to make the significant financial investment that would be needed to produce large multi-chip modules which could package an entire computer or computer function.

One alternative approach has been to use a low thermal expansion and low dielectric constant material such as silica-filled polytetrafluoroethylene (PTFE). To overcome process problems, a spray coating of polyimide is used to protect the silica-filled PTFE from process chemicals in the fabrication of an organic chip carrier, as proposed in commonly assigned U.S. patent application Ser. No. 08/790,245, filed Jan. 28, 1997.

U.S. Pat. No. 4,847,146 to Yeh et al. describes a printed wiring board upon which a ceramic leadless chip carrier is mounted. The printed wiring board has an expansion layer as a surface layer bonded to an underlying rigid support layer, which is a multi-layer laminated board, by an intervening adhesive layer. The adhesive layer is not bonded to the expansion layer at the area beneath the chip carrier by providing a polytetrafluoroethylene layer between the expansion layer and the adhesive layer at that area. The polytetrafluoroethylene layer is thereby used to produce an unbonded area which prevents adhesion of the support layer to the expansion layer so that the expansion layer is free to expand and contract with the chip carrier irrespective of the remainder of the printed wiring board.

U.S. Pat. No. 4,849,284 to Arthur et al. describes a ceramic filled fluoropolymer-based electrical substrate material suitable for forming rigid printed wiring board substrate materials and integrated circuit chip carriers. Conductive patterns and circuits are provided on individual ceramic filled fluoropolymer substrate layers to provide circuit substrates used in the construction of a multilayer board, and plated through holes interconnect selected circuit patterns in a known manner. The circuit substrate also can be used on the top surface of a leadless chip carrier package.

U.S. Pat. No. 5,194,713 to Egitto et al. describes removal of excimer laser debris in a method of fabricating a microelectronic circuit package having a glass fiber reinforced perfluorocarbon polymer dielectric.

Other conventional chip carrier and module constructions are described, e.g., in U.S. Pat. No. 4,965,702 to Lott et al., U.S. Pat. No. 5,249,101 to Frey et al., U.S. Pat. No. 5,264,664 to McAllister et al.

SUMMARY OF THE INVENTION

The present invention provides a packaging platform for interconnecting integrated circuit chips and cards, in which the platform is a circuitized fluoropolymer-based laminate carrier including high purity fluoropolymer protective barriers on its surfaces.

More particularly, a skived polytetrafluoroethylene layer is formed on each of the upper and lower outermost major surfaces of a fluoropolymer-based laminate carrier structure to protect ceramic-containing fluoropolymer dielectric layers in the polymer-based laminate structure against absorption of process chemicals, such as photoresist stripping chemicals, encountered during fabrication of the carrier.

In one preferred embodiment, the present invention uses a polytetrafluoroethylene (PTFE) layer that is free and devoid of ceramic constituents, such as silica, as an outer covering layer to protect ceramic-containing polytetrafluoroethylene dielectric layers in the laminate carrier against attack by process chemicals, such as resist strippers.

Also, a metal capping technique is used on the vias and through holes that does not require precious metal on both the partially completed circuit board and the foil, but instead merely on the partially completed circuit board. This simplifies processing by eliminating one plating step, and eliminates the need for precise alignment.

Because of the materials and processes selected to manufacture the high performance packaging carrier platform used in this invention, there is complete flexibility in the types of chips which can be mounted on the electronic package: C4 flip chip, low temperature flip chip, or wire bond. In addition, ease of manufactureability and processing costs have been considered when laying out the packaging platform approach. Also, the fine line circuitry capability of the metallized ceramic modules produced by this invention is sufficient to wire-out the current generation of high density chips. Additionally, the elimination of one level of packaging becomes an achievable high yield manufacturing commodity. Also, the implementation of this invention does not require the outlay of large amounts of capital in order to set up a manufacturing line capable of forming and using the carrier platform of the invention in electronic packaging.

BRIEF DESCRIPTION OF THE DRAWINGS

The foregoing and other features, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
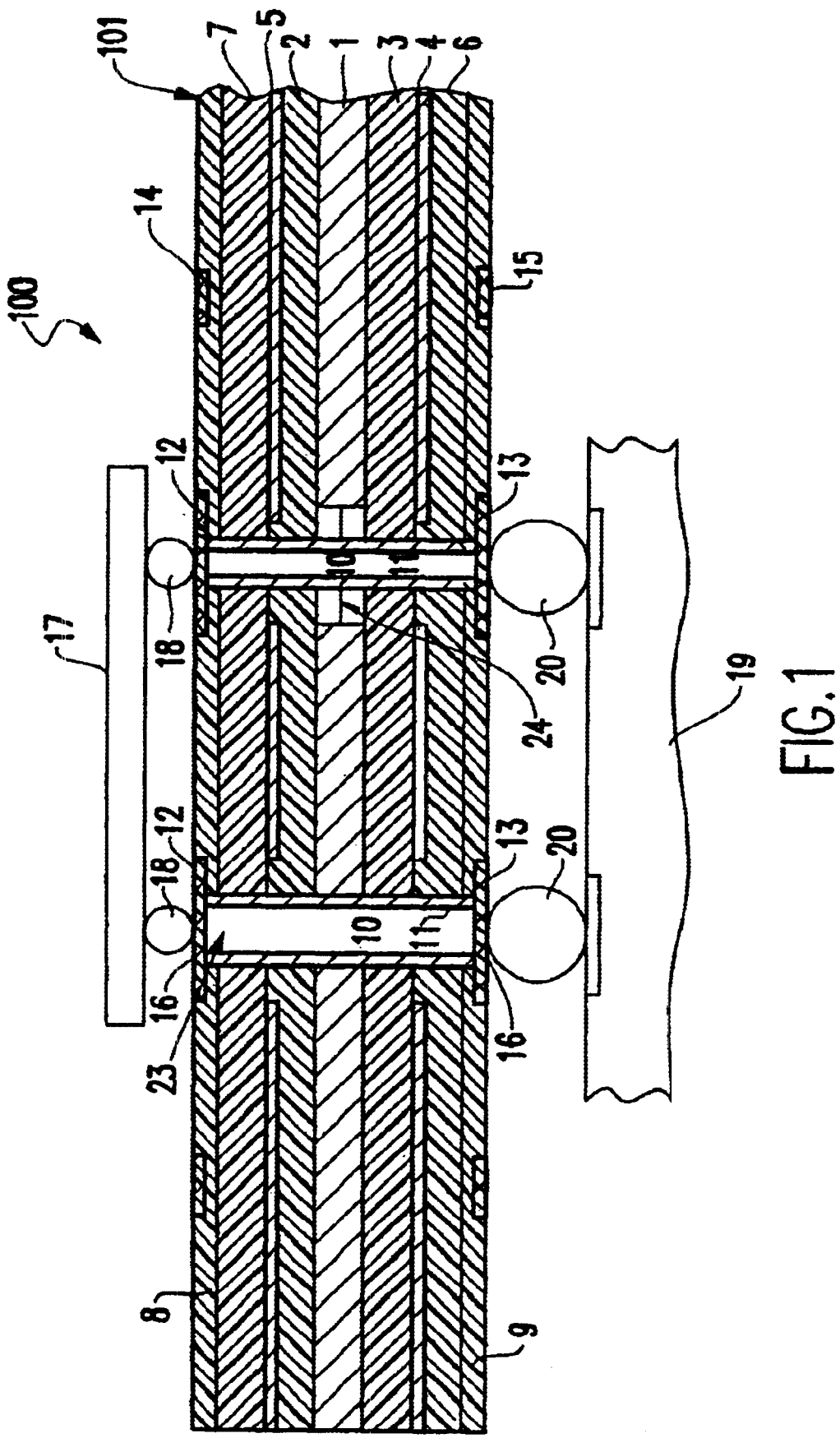
FIG. 1 is a cross section of an embodiment of an organic carrier (card platform) mounting an I/C chip and mounted on a substrate according to the present invention.

Referring now to the drawings, and more particularly to FIG. 1, there is shown a cross-sectional view of an illustration of the present invention. A circuitized structure (module) 100 is provided which includes a carrier 101 used as a platform for interconnecting an integrated circuit chip 17 and a card (substrate) 19. A general overview of the depicted features of FIG. 1 is initially provided hereinafter, followed by a more detailed discussion of individual components of the exemplified electronic package.

The carrier 101 is comprised of a compensator layer 1 (which will be described in detail below) and a first inner dielectric layer 2 laminated to one side of the compensator layer 1 and a second inner dielectric layer 3 laminated to the other side of the compensator layer 1. A first ground or power plane 5 is disposed on the first inner dielectric layer 2 and a second ground or power plane 4 disposed on one side of the second inner dielectric layer 3. Disposed on one side of first ground plane 5 is first intermediate dielectric layer 7. A second intermediate dielectric layer 6 is disposed on one side of the second ground plane 4. The dielectric layers 6 and 7, as well as dielectric layers 2 and 3, are composite materials having fluoropolymer matrix, such as a PTFE matrix, containing, as a filler ingredient, ceramic particulate filler, such as silica (e.g., amorphous fused silica powder). The ceramic-filler in the fluoropolymer provides compliancy and dimensional stability needed in making the carrier laminate 101 suitable for surface mount applications. The problem that is resolved by the present invention is that the ceramic filler, if allowed to become exposed to process chemicals such as resist strippers, is corroded and the layer degrades.

To avoid the afore-mentioned problem, a first skived PTFE barrier layer 8 is formed on first dielectric layer 7, and a second skived PTFE barrier layer 9 is formed on second dielectric layer 6. The PTFE barrier layers 8 and 9 are free of ceramic components and additives, such as silica or glass, and like materials which are not chemically inert to the presence of standard processing chemicals used to lithographically define fine line circuitry, electrical interconnection pads, and the like.

The fluoropolymer barrier layers 8 and 9 consist essentially of fluoropolymer, i.e., while it is preferred to use 100% pure fluoropolymer material in barrier layers 8 and 9, the presence of merely trace amounts of impurities of ceramics in the layers 8 and 9 is also within the scope of the invention, as long as the trace amounts of ceramics are not present in amounts sufficient to sustain attack by process chemicals extensive enough to permit penetration of the process chemical through the thickness of the barrier layer.

Through holes 10, which are plated with conductive plating 11, are disposed in carrier 101. (Alternatively, through holes 10 can be filled with conductive fill). Through holes 10 may be blind or may extend through the carrier 101. Clearance holes 24 can be provided to prevent contact between compensator 1 and the plating 11 on the walls of the through holes 10. Clearance holes 24 also can be used to isolate the ground planes and power planes 4 and 5 from through holes 10 as needed for the circuitry design. Pads 12 and 13 are formed by conventional methods at the openings 23 of through holes 10. The pads 12 and 13 have a diameter greater than that of the through hole openings 23 at the surface of the barrier layers 8 and 9. A copper foil cap 16 is applied over the entrances to the through holes 10. A first layer of circuitry 14 is disposed on the first skived PTFE layer 8, and a second layer of circuitry 15 is disposed on the second skived PTFE layer 9. The fine line circuitry 14 and 15 can have a line width less than about 1 mil (about 25 $\mu$m) and a line spacing of about 1.5 mil (about 38 $\mu$m). At this juncture, a carrier 101 of the invention is provided.

An integrated circuit chip 17 is attached to fine line circuitry 14. Solder balls 18 connect the chip 17 to the copper foil caps 16 or to the pads 12, and, optionally to the circuitry 14. Carrier 101 is attached to substrate 19, preferably by ball grid arrays 20. Suitable substrates include, for example, circuitized substrates, such as circuit boards, cards, carriers, organic and inorganic single chip modules, organic or inorganic multi-chip modules, and ceramic carriers.

Standard photoresists and photolithographic techniques are used to pattern the circuitry 14, 15, pad 12, 14 and capped via film 16. One important aspect of this invention is the provision of means to protect the ceramic-filled dielectric layers 6 and 7, such as silica-filled dielectric polytetrafluoroethylene dielectric layers, from corrosion that would otherwise occur if they were contacted with process chemicals used to lithographically define the circuitry 14, 15, pads 12, 13 and capped via film 16. To this end, high purity fluoropolymer films 8 and 9, viz., "high purity" meaning having a content composed of at least 99% by wt. pure fluoropolymer, are provided as outer barrier layers on the carrier 101. Barrier layers 8 and 9 protect the ceramic-filled fluoropolymer dielectric layers 6 and 7 from attack and loss of integrity by process chemicals. Process, chemicals, such as dodecyl benzene sulfonic acid used as a resist stripper, aggressively attack the ceramic filled dielectric layers. Preferably, the skived fluoropolymers layers 8 and 9 are high purity PTFE layers. The skived PTFE layers 8 and 9 generally should have a thickness of about 0.1 to about 10 mils (about 2.5 to 254 $\mu$m), more preferably about 0.5 to about 1 mil (about 12.7 to 25 $\mu$m). The functional restrictions on the upper and lower thickness limits of layers 8 and 9 are due to the relatively high out of plane thermal coefficient of expansion of unfilled PTFE, which results in high out-of-plane stresses on the plated through holes upon temperature changes.

Fluoropolymer materials usable as the barrier layers 8 and 9 generally include, for example, polyhedra-fluoroethylene, copolymers of fluorinated monomers such as hexafluoropropene (HFP), tetrafluoroethylene (TFE), and perfluoroalkyl vinyl ether (PAVE). Polytetrafluoroethylene is preferred. A commercially-available source of a skived high purity PTFE layer useful as barrier layers 8 and 9 is available under the trade name Teflon® from E.I. DuPont de Nemours and Company.

The dielectric layers 2, 3, 6 and 7 are based in part on a fluoropolymer material which can be the same type of fluoropolymer materials as described above for the high purity barrier layers 8 and 9, with a difference being that dielectric layers 2, 3, 6 and 7 use the fluoropolymer as a matrix material which is filled with a ceramic particulate, such as silica. The dielectric constant of the dielectric layers 2, 3, 6 and 7 is preferably from about 1.5 to 3.5, more preferably 2 to about 3. The thickness of the filled dielectric layers 2, 3, 6 and 7 can vary according to the desired design performance characteristics of the carrier 101. The dielectric layers 2, 3 , 6 and 7 preferably do not contain woven fiberglass as such absence of woven fiberglass enables through holes 10 to be closely spaced, if desired or necessary. Indeed spacing less than 100 mils (2540 μm), preferably less than 50 mils (1270 μm), more preferably 25 mils (635 μm), and most preferably less than 10 mils (254 μm) between centers, is achievable without shorting between the through holes 10. The coefficient of thermal expansion of the dielectric layers 2, 3, 6 and 7 is preferably from about 20 to 80 ppm/° C., more preferably from about 20 to 30 ppm/° C. Preferably the ceramic particulate filler has a diameter less than about 10 μm, more preferably from about 5 to about 8 μm. Preferably the ceramic particulate filler is present from about 30 to about 70 percent by weight, more preferably from about 40 to about 60 percent by weight. Preferably the ceramic particulate is silica. A suitable source of dielectric for dielectric layers 2, 3, 6 and 7 is a silica-filled polytetrafluoroethylene having the trade name "Rogers 2800," available from Rogers Corporation, Rogers Connecticut.

Additionally, in order to closely match the linear expansion coefficient of a card platform (carrier) 101 with the silicon integrated circuit chip 17, a copper-INVAR-copper (CIC) compensator 1 preferably is used in the center of the card platform 101. The CIC can be obtained from Texas Instruments, Attleboro, Mass. The component INVAR is a trademark designation for a nickel-iron alloy with a low thermal coefficient of expansion of 2.8 ppm/° C., viz., a 36% nickel-63% iron alloy available from Texas Instruments. This compensator 1 serves as the "backbone" of the platform 101 and contains the primary fiducial registration system to which all subsequent circuitry will be registered to. Preferably the compensator 1 is stiff to provide the carrier 101 with rigidity. Preferred compensators 1 are three layered structures (not shown) comprised of a first sublayer of copper, a second sublayer of 36% nickel-63% iron alloy (which has a coefficient of thermal expansion (CTE) of close to zero in the operating layer of the carrier), and a third sublayer of copper. Preferably the compensator comprises 75% of a 36% nickel-63% iron alloy, and 25% copper. A suitable 36% nickel-63% iron alloy is INVAR. Alternatively, the compensator is formed of a single metal such as INVAR. The choice of the material for the compensator, together with the choice of material for the dielectric, will control the coefficient of thermal expansion (CTE) of the carrier 101. Preferably the compensator has a thickness of from about 0.001 to about 0.009 inches (about 25 to 229 μm), preferably about 0.006 inches (about 152 μm).

The ground or power circuitry layers 4 and 5 can be formed of copper or CIC or other conductor material as is well known. The first and second layers of circuitry 4 and 5 can be formed between the dielectric layers 2 and 7, and between dielectric layers 3 and 6, using conventional techniques, including for example, lamination, vacuum deposition, evaporation, sputtering, seeding followed by electroless plating, plating, electron beam deposition, laser deposition or by vacuum deposition followed by electroplating.

The cap film 16 can be an electrodeposited copper foil that is either laminated or plated to the barrier layers 8 and 9. The cap film 16 has a thickness generally between about 0.5 mils and 2.0 mils (about 12.7 to 51 μm).

The various materials, and thickness of the various materials, are selected such that among other properties, the resultant chip carrier 101 will have an overall coefficient of thermal expansion (CTE) of about 5 to about 20, and preferably about 10 to about 15 ppm/° C. The carrier 101 is capable of carrying at least 500 to 800 signal I/O's (input/output). Preferably, the carrier platform 101 includes no individual layer that is entirely ceramic; for instance, the dielectric layers 2, 3, 6 and 7 are instead based on organic matrix materials.

A exemplary method for assembling the various components of the electronic package 100 is now discussed with reference to FIGS. 2–5.

Figure 2:
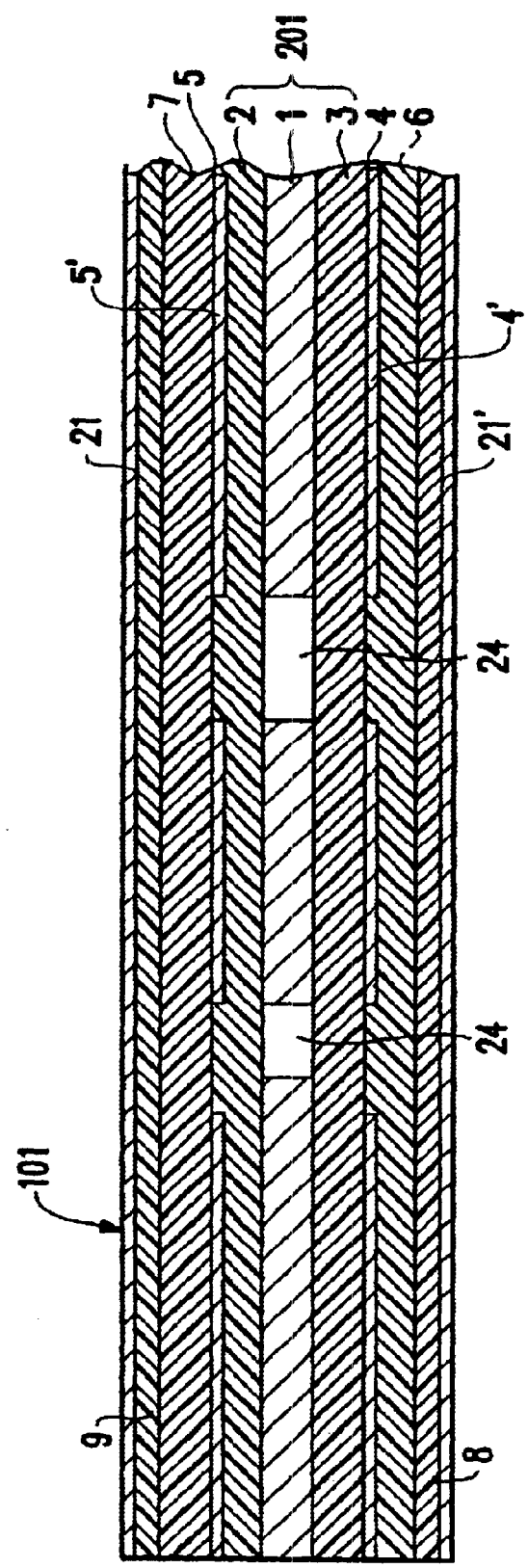
FIGS. 2–5 are cross-sectional schematics of the organic carrier of the present invention at various stages of its fabrication.

As indicated in FIG. 2, in the assembly of the layers of the carrier platform 101, an initial intermediate sandwich 201 was assembled composed of a top layer 5' which was a first 0.7 mil (18 μm) copper sheet; a 2 mil (51 μm) "RO2800" silica filled PTFE sheet 2; a copper-Invar-copper (CIC) compensator 1 obtained from Texas Instruments, Attleboro, Mass.; a 2 mil (51 μm) "RO2800" silica filled PTFE sheet 3; and a second 0.7 mil (18 μm) copper sheet 4' as the bottom of the sandwich. The compensator 1 was patterned to provide clearance holes 24.

The clearance holes 24 were made in such a linear expansion compensator be made by mechanical drilling. Furthermore, if additional voltage and ground planes are needed in the package, said voltage and ground planes are manufactured by drilling clearance holes in the individual metal layers prior to final lamination of the sub-composite structure. Each layer of metal which is being drilled with clearance holes have special "fiducial holes" drilled in the layers at the time when the clearance holes are being drilled, and that the preferred method is to use the same drilling machine, thereby eliminating any errors due to mechanical or optical registration schemes.

The sandwich layers are laminated together using what is commonly known as "pin-parallel" lamination with the following exceptions: the layers are registered to each other using an optical registration tool which locates the fiducial holes that are drilled in each layer. Each layer is temporarily "glued" to the next until the entire platform is laid up. Actual joining of the lay up is then permanently accomplished in a suitable lamination press, such as available from TMP, Inc. with pressing at about two hours at about 370° C. and then the intermediate sandwich 201 is cooled. The copper sheets 4' and 5' on the outside of the intermediate sandwich structure 201 are patterned by conventional methods to form copper ground planes 4 and 5.

Next, 1.5 mil (38 μm) sheets 6 and 7 formed of "RO2800" silica filled PTFE are placed on the exposed sides of the copper ground planes 4 and 5. Then, 1.0 ml (25 μm) thick Teflon® layers 8 and 9 are applied over silica-filled sheets 6 and 7 to completely blanket the latter. Then, copper foils 21 and 21' having a thickness of 0.7 (18 μm) mils are placed on the exposed sides of Teflon® sheets 8 and 9 and the entire assembly placed in the lamination press for about 5 hours at 370° C., to provide copper clad laminate.

Figure 3:
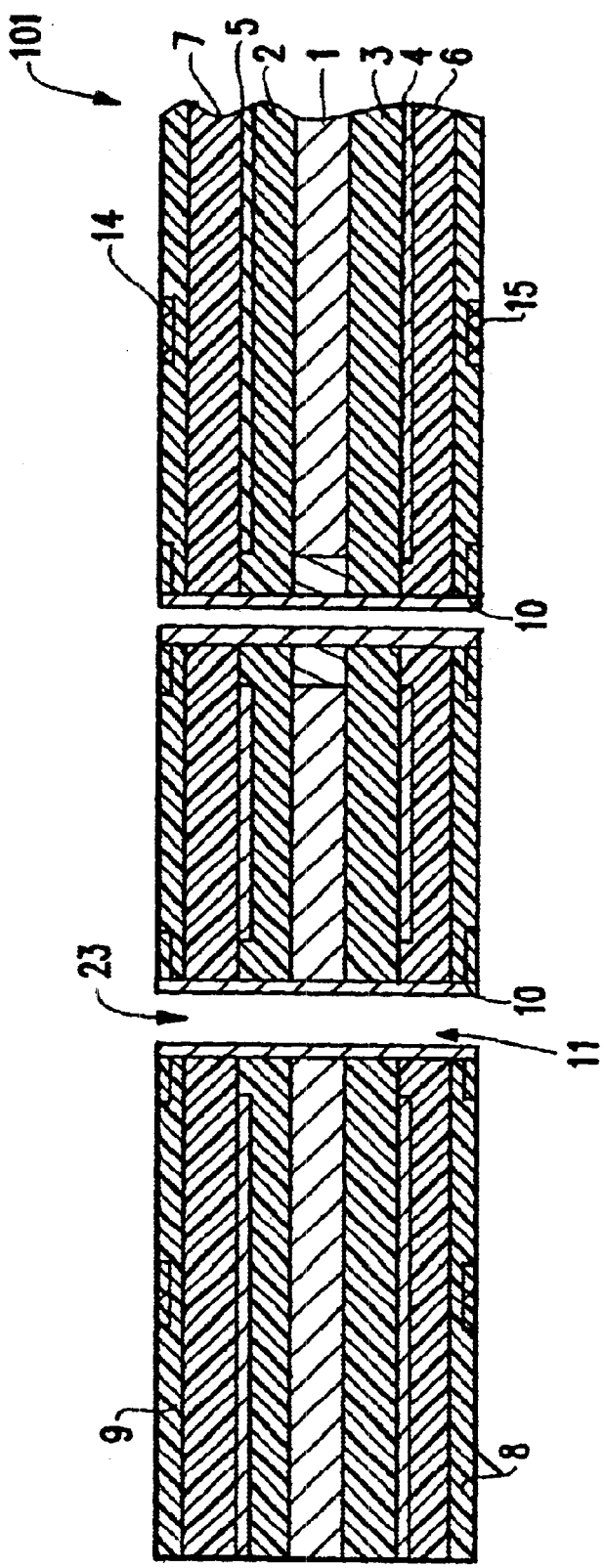

Next, as shown in FIG. 3, through holes 10, about 6 mil (about 152 μm) in diameter, were mechanically drilled at a spacing of 18 mils (457 μm), on center, through the copper clad laminate and plated with plating 11, preferably copper plating, using conventional techniques. Drilled through holes 10 are registered to the platform 101 by laser clearing out the laminate material covering the "primary fiducial holes" which were originally drilled in the compensator layer 1. As in the usual sequence of board processing, the through holes 10 are drilled, cleaned, seeded, and plated with copper. The circuit patterns 14 and 15 are also formed at this stage by conventional techniques. One important aspect of this invention is the use of high purity PTFE material layers 8 and 9 on the outermost layers 8 and 9 of the laminate construction 101. The use of this material was found to be necessary in order to be compatible with all of the processes that are routinely used in the metallized ceramic line. A finding of the present invention is that the high purity PTFE material used in layers 8 and 9 is compatible with J100 resist stripper (i.e., a dodecyl benzene sulfonic acid) used in the fabrication of the fine line wire-out layers in the metallized ceramic line.

Figure 4:
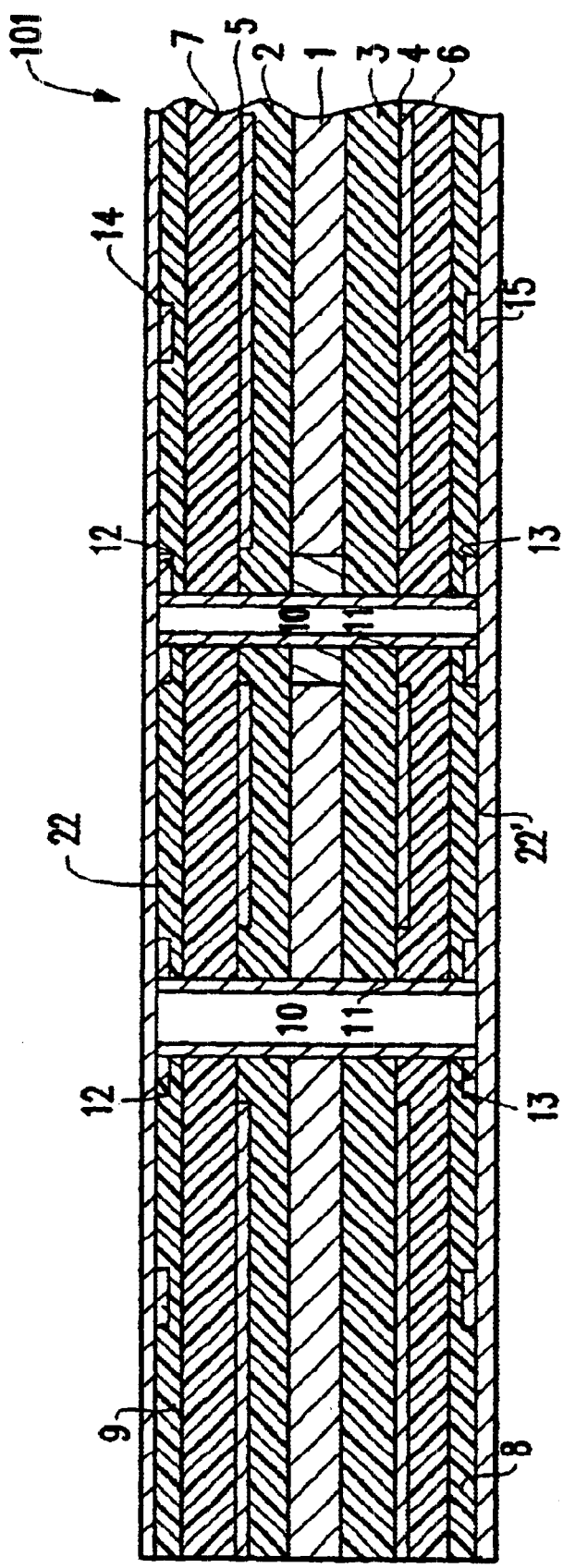

Next, as shown in FIG. 4, pads 12 and 13 are formed at the through holes 10. In order to gain back the surface "real estate" lost to the drilling and plating of the through holes 10, the major surfaces of the platform 101, i.e., the partially completed circuit board, are covered with copper foils 22 and 22', each foil having a thickness of about 0.7 mils (about 18 μm). This is accomplished by first defining lands represented by the pads 12 and 13 and circuit patterns 14 and 15 on the surfaces of the platform 101 using photolithographic techniques, and then selectively plating the exposed (unmasked) lands with an appropriate joining metal. The appropriate joining metal is a metal favorable to alloying with the copper cap foil metallurgy to be added to the lands on which joining is to be accomplished. This joining metal may be precious metal such as gold, or an alloy of gold and tin. Then, foils 22 and 22' of specially treated copper are laminated to the precious metal-covered lands, thereby metallurgically bonding the treated sheet of copper to all of the joining lands and at the same time bonding to all areas of exposed dielectric on the surface. It greatly simplifies manufacture of the platform and does not require a separate manufacturing process to make caps or to precisely register the caps to the platform 101. The process used in this invention to provide the special pretreatment of the copper cap foils 22 and 22' involves removing native oxide prior to joining the sheets 22 and 22' to the lands by use of a 90 second dip of the sheets 22 and 22' in sodium persulfate, which is done to the entire surface areas of copper sheet materials 22 and 22' and not merely to selective foil areas which will ultimately register with locations of the through holes 10. This operation thereby can eliminate the necessity of having to selectively plate with precious metal the locations on the sheets 22 and 22' that will correspond to the board holes 10 that are to be capped by this operation. Although not required, the copper cap foil 22, 22' could optionally be coated with a layer of another metal, but preferably one that can be etched and processed with same chemistries and methodologies as the base copper, such as nickel.

The copper foils 22 and 22', once pretreated and then laminated to the platform 101, are selectively etched using photolithographic techniques to leave metal caps 16 on the openings 23 of the through holes 10, and on circuitry 14 and 15. The photoresist can be safely stripped with chemicals such as dodecyl benzene sulfonic acid without affecting the integrity of the exposed portions of high purity PTFE material layers 8 and 9.

The final raw card step is to make the exposed, pure PTFE surfaces 8 and 9 wettable for polyimide or other protective film material to be applied in the subsequent ceramic line. This can be accomplished two ways. One way is by treating the surface with oxygen plasma for 12 minutes, ultra sonic cleaning, and then treating the surface with forming gas plasma using a source gas mixture of 10% vol. hydrogen/90% nitrogen with the cycle of treatment comprised of 9 minutes of plasma on, 9 minutes of plasma off, and then 9 minutes of plasma on again. The other way is treating the surface with an etchant having the trade name Tetraetch, which has a composition of 25% sodium naphthalene/75% ethylene glycol dimethyl ether complex, and is available from W.L. Gore Company.

Figure 5:
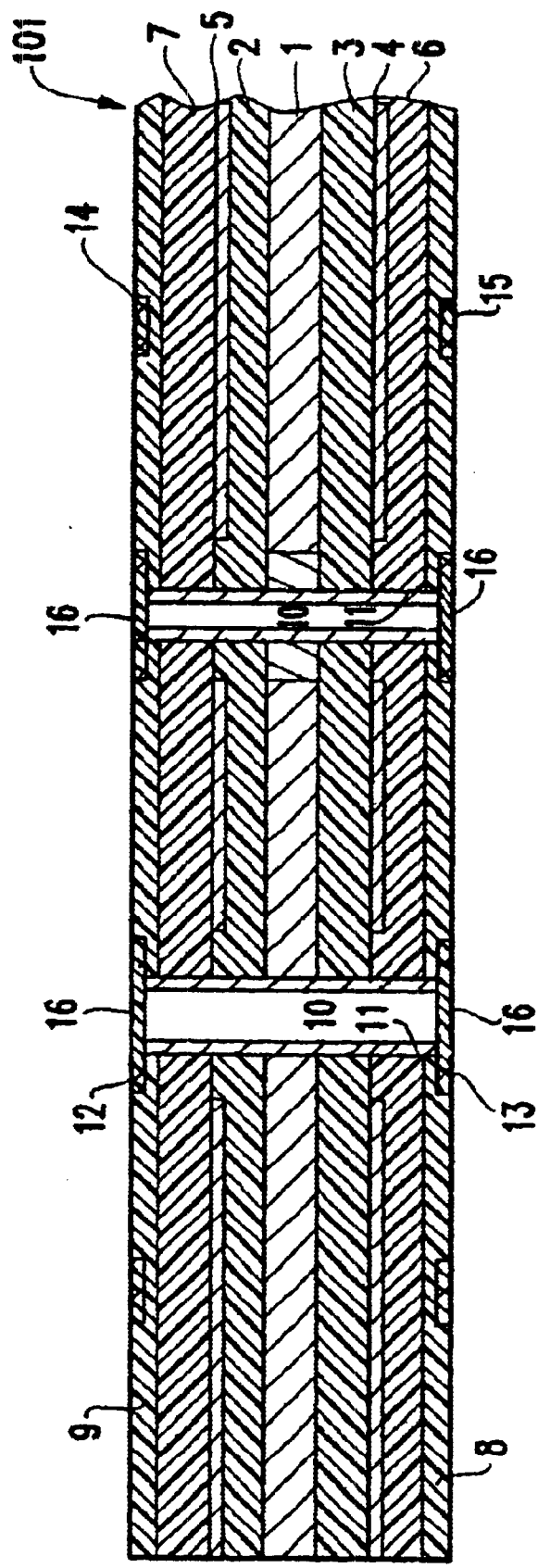

Referring to FIG. 5, the final step in manufacturing the finished performance platform card 101 is to complete the circuitization of the platform 101 using metallized ceramic circuitization techniques. The processes used are those which are routinely used to form two high density circuitry layers on ceramic modules. Only in this case, the platform 101 may be covered with two layers of circuitry on each side of the card, forming a 4S card. The processes used to create the fine line circuitry are well know by those skilled in the manufacture of metallized ceramic modules. The size of the card which may be produced by such a line is only limited by the process capability of the production line. Chip 17 is then attached to the carrier at temperatures of about 350 to 400° C., using solder reflow techniques. The carrier 101 also can then be attached to the substrate 19 using solder reflow techniques.

While the invention has been described in terms of a single preferred embodiment, those skilled in the art will recognize that the invention can be practiced with modification within the spirit and scope of the appended claims.

Having thus described my invention, what we claim as new and desire to secure by letters patent is as follows:

1. A packaging platform useful for interconnecting integrated circuit chips and cards, in which the platform comprises:

a circuitized laminate having opposite outer surfaces;

at least one ceramic-containing dielectric layer disposed on at least one of the opposite outer surfaces of said circuitized laminate;

at least one outermost protective impermeable flouropolymer barrier layer devoid of ceramic material disposed on and covering said at least one ceramic containing dielectric layer, said outermost protective impermeable flouropolymer barrier layer being impermeable to process chemicals encountered during fabrication of said integrated circuit chip and permitting metallized ceramic line processes without degradation of said integrated circuit chip;

at least one through hole extending between opposite outer surfaces of said laminate; and a conductive material coating said at least one through hole.

2. The packaging platform of claim 1, wherein said barrier layer is polytetrafluoroethylene.

3. The packaging platform of claim 1, wherein said ceramic containing dielectric layer is silica filled polytetrafluoroethylene.

4. The packaging platform of claim 1 further comprising at least one conductive pad disposed atop the through hole and a conductive cap covers an opening of the through hole.

5. A packaging platform, comprising:

a compensator layer;

a first inner dielectric layer laminated to one side of the compensator layer;

a second inner dielectric layer laminated to the opposite side of the compensator layer;

a first ground or power plane disposed on the outer side of the first inner dielectric layer;

a second ground or power plane disposed on the outer side of the second inner dielectric layer;

a first intermediate dielectric layer disposed on said first ground or power plane;

a second intermediate dielectric layer disposed on the second ground or power plane;

a first fluoropolymer barrier layer formed on the first intermediate dielectric layer;

a second fluoropolymer barrier layer formed on the second intermediate dielectric layer;

a through hole extending between outer surfaces of said first and second fluoropolymer barrier layers;

a conductive material coating said through hole; and clearances between said conductive material and said compensator layer proximate to said through hole;

wherein said first and second fluoropolymer barrier layers are devoid of ceramic components, and said first and second intermediate dielectric layers comprise ceramic containing fluoropolymers.

6. The packaging platform of claim 5, wherein said first and second inner dielectric layers comprise ceramic containing fluoropolymers.

7. The packaging platform of claim 5, wherein said outermost and opposing outermost impermeable flouropolymer barrier layers are polytetrafluoroethylene.

8. The packaging platform of claim 5, wherein said compensator layer is a multilayered integral structure, comprising, in this sequence, of a copper layer, an Invar layer, and a copper layer.

9. The packaging platform of claim 5, further comprising at least one through hole extending between said first and second fluoropolymer barrier layers, wherein said through hole is coated with a conductive material and at least one conductive pad is disposed atop the through hole and a conductive cap covers an opening of the through hole.

10. A circuitized structure, comprising:

a) a circuitized substrate;

b) a platform carrier, electrically and mechanically connected to the substrate, comprising:

a laminate having opposite outer surfaces and including at least one ceramic containing dielectric layer disposed and covering one of said opposite outer surfaces, said surfaces further comprising fine line circuitry and at least one outer most impermeable protective flouropolymer barrier layer devoid of ceramic material wherein said outer most impermeable barrier layer covers said at least one ceramic-containing dielectric layer and is impermeable to process chemicals encountered during fabrication of said circuitized structure and permits metallized ceramic line processes without degradation of said circuitized structure;

at least one through hole extending between opposite outer surfaces of said laminate;

a conductive material coating said at least one through hole; and c) a chip, disposed on the carrier and electrically and mechanically connected to said fine line circuitry.

11. The circuitized structure of claim 10, wherein said fine line circuitry has a line width less than about 25 $\mu$m and a line spacing of about 38 $\mu$m or less.

12. The circuitized structure of claim 10, wherein chip connection to said fine line circuitry is selected from the group consisting of a wire bond and a flip chip attachment.

13. A packaging platform useful for interconnecting integrated circuit chips and cards, in which the platform comprises:

a circuitized laminate having opposite outer surfaces;

at least one ceramic-containing dielectric layer disposed on at least one of the opposite outer surfaces of said circuitized laminate;

at least one outermost protective impermeable fluoropolymer barrier layer devoid of ceramic material disposed on and covering said at least one ceramic containing dielectric layer, said outermost protective impermeable fluoropolymer barrier layer being impermeable to process chemicals encountered during fabrication of said packaging platform for said integrated circuit chip and permitting metallized ceramic line processes without degradation of said integrated circuit chip;

a compensator layer disposed on and partially covering another of said at least one ceramic-containing dielectric layer, said another of said at least one ceramic-containing dielectric layer opposing said at least one outermost protective impermeable fluoropolymer barrier layer;

at least one through hole extending between opposite outer surfaces of said laminate;

a conductive material coating said at least one through hole; and clearances between said conductive material and said compensator layer proximate to at least one of said through holes, said clearances isolating said conductive material from said compensator layer.

* * * * *